United States Patent [19]
Choi et al.

[11] Patent Number: 5,686,754
[45] Date of Patent: Nov. 11, 1997

[54] POLYSILICON FIELD RING STRUCTURE FOR POWER IC

[75] Inventors: Chongwook Chris Choi, Redondo Beach; Niraj Ranjan, El Segundo, both of Calif.

[73] Assignee: International Rectifier Corporation, El Segundo, Calif.

[21] Appl. No.: 660,716

[22] Filed: Jun. 10, 1996

Related U.S. Application Data

[63] Continuation of Ser. No. 274,012, Jul. 12, 1994, abandoned.

[51] Int. Cl.⁶ .......................... H01L 29/76; H01L 23/58; H01L 29/00
[52] U.S. Cl. .......................... 257/488; 257/372; 257/409; 257/500; 257/501
[58] Field of Search .......................... 257/372, 409, 257/488, 500, 501

[56] References Cited

U.S. PATENT DOCUMENTS

| | | | |
|---|---|---|---|
| 4,000,507 | 12/1976 | Nishida et al. | 257/488 |
| 4,900,693 | 2/1990 | Manning | 257/488 |
| 4,937,756 | 6/1990 | Hsu et al. | 257/372 |
| 5,187,552 | 2/1993 | Hendrickson et al. | 257/409 |
| 5,223,735 | 6/1993 | Kinoshita et al. | 257/409 |
| 5,374,843 | 12/1994 | Williams et al. | 257/492 |

FOREIGN PATENT DOCUMENTS

| | | | |
|---|---|---|---|
| 61-51961 | 3/1986 | Japan | 257/372 |
| 2-139963 | 5/1990 | Japan | 257/409 |
| 2080616 | 2/1982 | United Kingdom . | |

OTHER PUBLICATIONS

Lin et al., "Shielded Silicon Gate Complementary MOS Integrated Circuit", *IEEE Transactions on Electron Devices*, vol. 19, No. 11, Nov. 1972, pp. 1199–1206.
WPI Abstract Accession No. 87-196771/28 and RD 278011 (ANON), 10 Jun. 1987.

*Primary Examiner*—Mahshid D. Saadat
*Assistant Examiner*—Valencia Martin Wallace
*Attorney, Agent, or Firm*—Ostrolenk, Faber, Gerb & Soffen, LLP

[57] ABSTRACT

A polysilicon field ring structure is used to eliminate any type of unwanted surface current leakage in an integrated power chip having high voltage and low voltage areas and enclosed in a plastic housing. All P-type diffusions not biased to the ground potential are surrounded by rings biased to the supply potential, and all N-type diffusions not biased to the supply potential are surrounded by rings biased to the ground potential.

14 Claims, 2 Drawing Sheets

14—LEVEL SHIFT

POLYSILICON FIELD RING STRUCTURE FOR POWER IC

This is a continuation of application Ser. No. 08/274,012 filed on Jul. 12, 1994 now abandoned.

BACKGROUND OF THE INVENTION

This invention relates to high voltage power integrated circuits, and more specifically relates to the provision of a polysilicon field ring structure to eliminate any type of unwanted surface current leakage.

Power integrated circuits are well known and commonly consist of a circuit having one or more high voltage sections and low voltage sections on the same monolithic chip. Both high and low voltage sections may contain analog/logic circuits composed of CMOS/bipolar devices as well as power devices. The high voltage sections are isolated from each other and from the low voltage section with a suitable technology such as junction isolation, self isolation, or dielectric isolation.

The upper surface of the chip has a suitable passivation coating, for example silicon oxide (silox), silicon nitride or silicon oxynitride and is molded over with a highly insulating plastic. The plastic completely encloses the chip and is in full contact with the upper surface of the chip. Pin connectors extend through the plastic housing and provide electrical connection to the chip. A typical power integrated circuit of this kind is High voltage MOS Gate Driver, IR2112, sold by International Rectifier Corporation, the assignee of the present invention.

Such plastic packaged high voltage power integrated circuits are liable to two types of unwanted surface current leakages. One is the leakage from surface inversion induced by metal polysilicon signal lines. This kind of leakage occurs only underneath the signal lines and is prevalent in low-voltage integrated circuits as well as power ICs. Also, this kind of leakage is permanent and is relatively independent of time and stress. To eliminate such leakage, various forms of channel stopper diffusion techniques have been used in the past, which have been demonstrated to be effective in both bipolar and CMOS circuits.

A second type of leakage caused by the package is due to surface inversion induced by mobile ions in the plastic package. It is believed that, under high temperature and reverse bias conditions, the mobile ionic contaminants present in the plastic move around freely over the chip surface and accumulate on certain areas of the chip surface, causing surface inversion of the underlying silicon. This kind of leakage can occur between diffusions of same type and different bias, and its effects are more pronounced in power ICs. Also, this kind of leakage varies with the amount and duration of both temperature and reverse bias stress.

In the case of power ICs consisting of bipolar devices only, various forms of field plating structures have been used to shield the silicon surface from unwanted inversion. For example, in a lateral PNP structure, the emitter metal line can be extended to shield the base. However, this structure is not effective in a CMOS circuit because the drain metal cannot shield the source and neither the source metal nor the gate polysilicon can be fixed in their bias.

Therefore, an effective method of eliminating both types of surface leakage is needed for a power IC consisting of CMOS circuits. Without eliminating such leakage, especially those of the second type, power ICs are limited to lower temperatures and bias conditions so that the mobility of the ionic contaminants is reduced. The ability to operate at 150° C. and at its full blocking voltage is needed because a power IC must often dissipate significant power and operate in high ambient temperature surroundings.

BRIEF DESCRIPTION OF THE INVENTION

In accordance with the present invention, a novel polysilicon field ring structure is provided in which all diffusion wells which can contribute to field leakage are surrounded by field rings biased to a potential which will block field induced leakage.

To eliminate all parasitic PMOS leakage in a CMOS circuit, for instance, all P-type diffusions not referenced to ground potential are ringed with polysilicon field rings which are connected to the supply potential. To eliminate all parasitic NMOS leakage, all N-type diffusions not referenced to supply potential are ringed with polysilicon rings which are biased to ground potential. Thus, unintended inversion regions cannot be formed from any of the P or N diffusions in the CMOS circuit. Furthermore, such rings are placed beneath all signal lines, such as the metal layer and the gate polysilicon layer. This technique, therefore, requires an extra polysilicon layer deposited before the gate silicon, and is especially cost-effective in a technology which employs such a layer. Such polysilicon rings are spaced from and insulated from the chip surface, and are spaced from and insulated from the interior surface of the plastic package housing the chip.

DETAILED DESCRIPTION OF THE INVENTION

Figure 1:
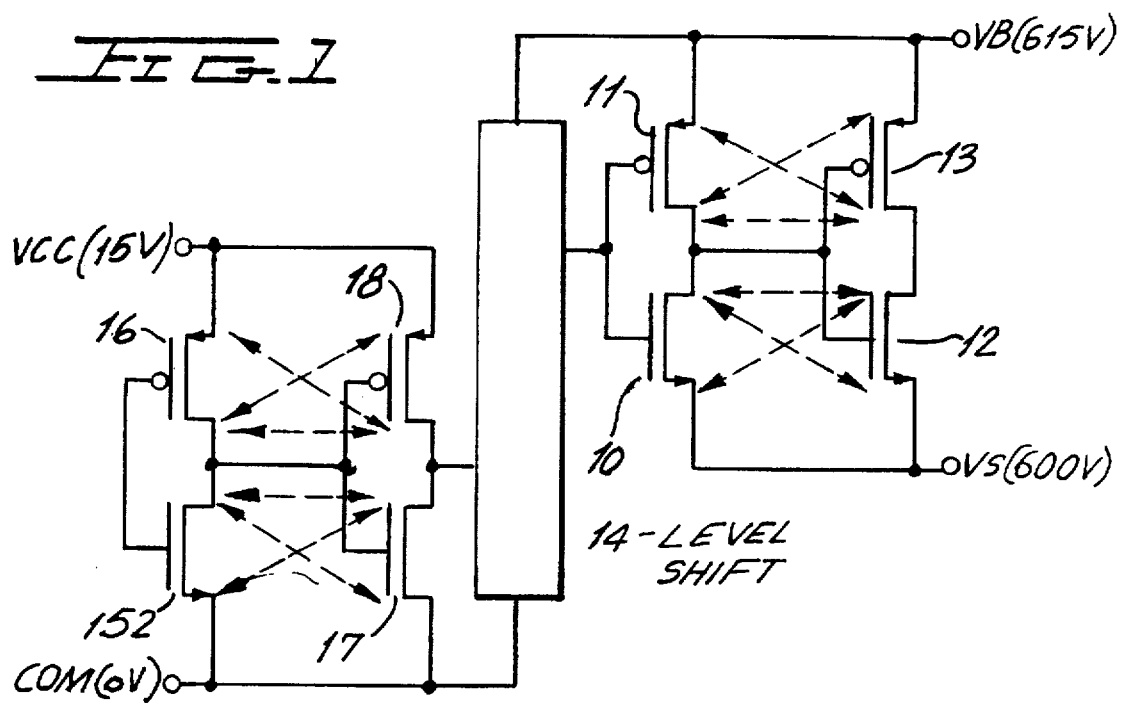
FIG. 1 is a schematic circuit diagram of a generalized circuit which can be implemented as a power integrated circuit.

FIG. 1 schematically shows a simple circuit having high and low voltage sections which can be carried out in power integrated circuit form. Obviously, power integrated circuits are often extremely complex in both their high and low voltage sections and in the implementation of those sections. However, the principles of the present invention are easily demonstrated for a simplified power integrated circuit based on the circuit of FIG. 1.

The circuit of FIG. 1 contains a circuit operating at high voltage (for example, 600 volts), consisting of complementary N channel and P channel MOSFETs 10 to 13. These are operated from a suitable low voltage control circuit (for example, 15 volts) consisting of complementary N and P channel MOSFETs 15 to 18. The low voltage circuit containing MOSFETs 15 to 18 is connected to the high voltage circuit containing MOSFETs 10 to 13 via the level shift circuit 14.

The source electrodes of MOSFETs 11 and 13 are connected to a high voltage source VB which may be at 615 volts while the source electrodes of MOSFETs 10 and 12 are at a voltage VS which may be at 600 volts. The source electrodes of MOSFETs 16 and 18 are connected to a low voltage source at 15V while the source of MOSFETs 15 and 17 are connected to ground. The circuit of FIG. 1 can, for example, be the driver for the high side MOSFET of a bridge circuit which requires a high voltage gate input relative to ground. Such devices are fully described in Data Sheet No. PD-6.026 dated June 1993 for the IR2112 Power MOSFET/ IGBT Gate Driver, published by the assignee of the present invention.

Figure 2:
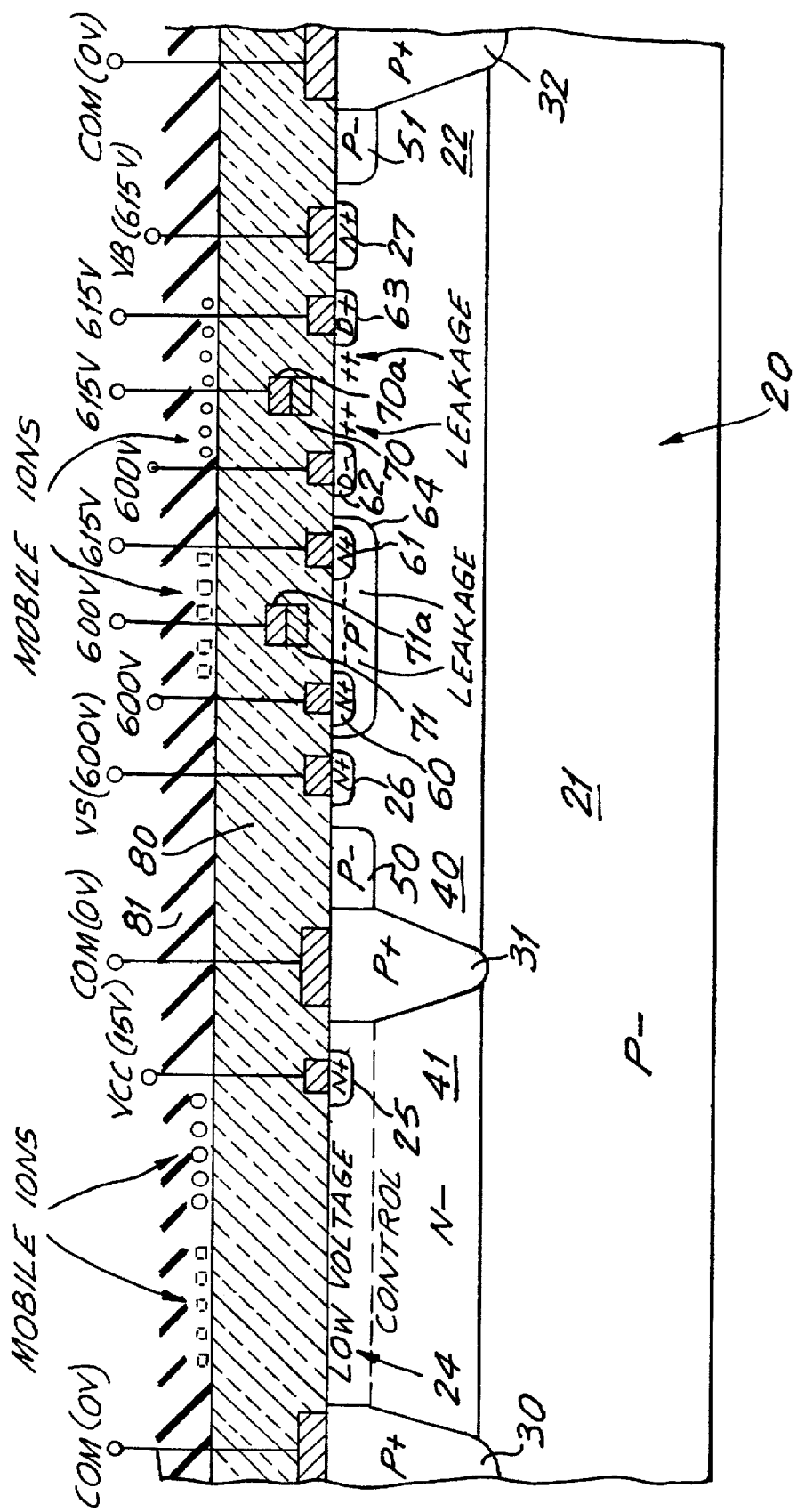
FIG. 2 is a cross-sectional view of a portion of a semiconductor chip which contains the circuit of FIG. 1 and which incorporates the novel invention for improving temperature and bias stability as well as for reducing field leakage.

When implementing the circuit of FIG. 1 in a common chip, the high and low voltage circuits are laterally isolated from one another. FIG. 2 shows a portion of such a chip in cross section. Thus, in FIG. 2, a silicon chip 20 consists of a P(−) substrate 21 which has an epitaxial layer 22 of N(−) silicon grown thereon. The N(−) region 22 is separated into high voltage and low voltage regions by P+ sinkers 30, 31, and 32. Thus, sinkers 30 and 31 define a high voltage device region 40 in epitaxial layer 22, separated from low voltage region 41. Regions 40 and 41 can have any desired topology. Moreover, any desired isolation technique can be used between regions 40 and 41.

The high voltage circuitry of MOSFETs 10 to 13 in FIG. 1 is shown as formed within high voltage region 40. The P+ contact regions 62 and 63, which are diffused in layer 22, represent any of the source and drains of P-channel MOSFETs 11 and 13 in FIG. 1. The P region 64 is diffused in layer 22 to form the P-type well region. The N+ contact regions 60 and 61, which are diffused in the P-type region 64, represent any of the sources and drains of N channel MOSFETs 10 and 12 in FIG. 1.

The low voltage control circuitry of MOSFETs 15 to 18 in FIG. 1 is schematically shown as formed within area 41. N+ contact region 25 is diffused in region 41 and receive an electrode which is at the low voltage supply. The low voltage control region 24 would also contain diffusions identical to the diffusions 60 to 64 in the high voltage region 40. However, all the N+ and P+ diffusions in the low voltage control region 24 would receive electrodes which are between 15V and 0V and these would represent the sources and drains of MOSFETs 15 to 18 in FIG. 1.

N+ contact regions 26 and 27 are diffused into layer 22 and receive metallic electrodes which can be at potentials between 615V and 0V. The P+ sinkers 30, 31, and 32 receive electrodes which are at zero or ground potential. P(−) resurf regions 50 and 51 may encircle the high voltage region 40 to provide isolation from low voltage region 41.

As is conventional, all devices within the silicon surfaces are overcoated by a dielectric, for example, a low temperature silicon dioxide (silox) layer 80 which may have a thickness of about 1.5 micrometers. Contacts to all surface electrodes penetrate the dielectric layer 80 and are taken to suitable external pins, not shown.

The device of FIG. 2 is also conventionally housed in a plastic housing 81 which overlies and contacts the upper surface of the completed chip as schematically shown in FIG. 2. Plastics used for the housing may be any suitable insulation material such as those sold under the tradenames Nitto MP-150SG, Nitto MP-180, and Hysol MG15-F.

It has been found that the structure described to this point is subject to surface field leakage current caused by the mobile ions in the plastic package as well as the signal lines. FIG. 2 shows the mobile ions in the plastic package that have accumulated at the interface between layer 80 and housing 81 over time due to the high temperature and high voltage applied to the chip. These mobile ions can cause surface inversion in regions 40 and 64 as shown in FIG. 2. These leakages are also shown in FIG. 1 as leakages among source and drain diffusions of same type. Whereas the field leakage caused by signal lines does not vary with time, the field leakage caused by the mobile ions in the plastic package will increase over time as long as the chip is operated under high voltage and high temperature. The latter field leakage, therefore, increases more rapidly if the chip is operated at higher voltage and/or higher temperature, and render the chip to be temperature-unstable.

In accordance with the invention, the field leakage path between diffusions 60 and 61 is interrupted by depositing a polysilicon ring 71 which receives an electrode 71a tied to the lowest potential in the region 40. Likewise, the field leakage path between diffusions 62 and 63 is interrupted by depositing a polysilicon ring 70 which receives an electrode 70a tied to the highest potential in the region 40. The same polysilicon ring structure can be implemented in the low voltage control region 24, the only difference being that all rings would be tied to 15V and 0V instead.

The polysilicon rings 70 and 71, in effect, shield the silicon surface beneath each ring from the mobile ions in the plastic package, thus preventing surface inversion. Polysilicon rings 70 and 71 may be spaced about 1.2 μm above the surface of chip 20 and may have a width of 3.5 μm and a height of 0.5 μm.

Figure 3:
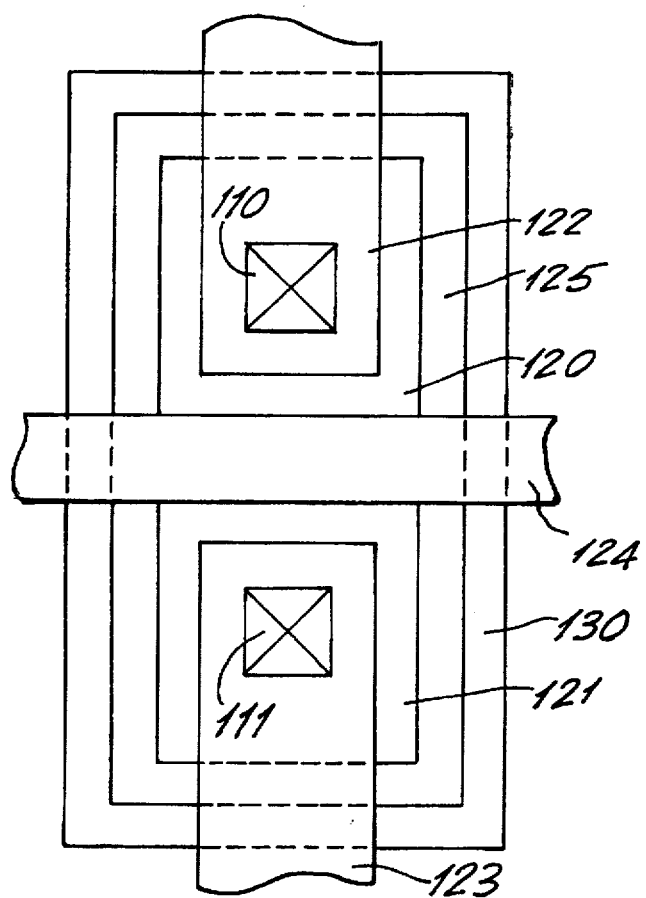
FIG. 3 is a top view of a MOSFET layout which incorporates the novel invention.

The polysilicon rings 70 and 71 shown in FIG. 2, are simply schematic representations. In an actual implementation, the rings would completely surround each diffusion region in order to prevent field leakage in all directions. FIG. 3 shows one typical topology for the invention, and shows the protection of a single MOSFET. Thus, spaced diffusion regions 120 and 121 and the gate polysilicon line 124 together form either an N-channel or P-channel MOSFET, depending on whether diffusions 120 and 121 are N or P, into an opposite type substrate 125. The source and drain of the MOSFET are tied to metallic electrodes 122 and 123 respectively through contact openings 110 and 111. A polysilicon ring 130, spaced above substrate 125 (in the manner of rings 70 and 71 of FIG. 2) surrounds the full extent of diffusion 120 and 121.

A structure without the polysilicon ring 130 is subject to both types of field leakage previously described. A field leakage induced by the signal lines would leak currents via signal lines 124, 122 and 123 to any other diffusion of same type tied to a different bias. The field leakage induced by the mobile ions in the plastic package would leak currents via all surfaces surrounding regions 121 and 122 except for regions underneath signal lines 122, 123, and 124. Such leakage can also occur between any other diffusion regions of the same type tied to a different bias.

By adding the polysilicon field ring structure 130 which is deposited underneath lines 122, 123, and 124 and biased appropriately, both types of field leakage is eliminated between regions 120 and 121 and any other diffusion regions.

The novel field ring structure described above can be used for devices other than MOSFETs, such as bipolar transistors, resistors, capacitors, diodes, etc.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A CMOS integrated circuit chip comprising a silicon substrate of one conductivity type and having at least one high voltage section aid at least one low voltage section; at least one isolation member for isolating said at least one high voltage section and said at least one low voltage section; a junction-receiving surface; a diffusion well of the other conductivity type in said junction-receiving surface; at least first and second spaced diffusions of said one conductivity type formed into said well and extending from said junction-receiving surface; at least third and fourth spaced diffusions of said other conductivity type formed in said junction-receiving surface; said first and second diffusions being included in first and second MOS transistors of said one conductivity type; said third and fourth diffusions being included in third and fourth MOS transistors of said other conductivity type; said first, second, third and fourth transistors being connected to define a CMOS circuit having a supply input terminal and a ground potential terminal; said junction-receiving surface of said substrate having an insulation coating thereon; source, drain and gate signal lines embedded in said insulation coating; and a plastic chip housing having inherent contaminant ions therein in contact with said insulation coating; the improvement which comprises a plurality of polysilicon rings embedded in said insulation coating each of which at least partly surrounds at least one of said first, second, third and fourth diffusions; said rings being located beneath the source, drain and gate signal lines; said rings surrounding said first and second diffusions being connected to one of said supply terminal or said ground potential terminal, said one of said supply terminal or said ground potential terminal being said supply terminal when said one conductivity type is P-type and being said ground terminal when said one conductivity type is N-type so that the electrical potential of said rings surrounding said first and second diffusions shield said silicon surface beneath said rings from the electrical potential formed by contaminant ions in said plastic housing thereby preventing inversion of the silicon surface beneath said rings; said third and fourth diffusions being connected to the other of said supply terminal or said ground potential terminal so that the electrical potential of said rings surrounding said third and fourth diffusions shield said silicon surface beneath said rings from the electrical potential formed by contaminant ions in said plastic housing thereby preventing said inversion of the silicon surface beneath said rings.

2. The device of claim 1 wherein said one conductivity type is N type.

3. The device of claim 1 wherein said polysilicon rings completely surround their respective diffusions.

4. The device of claim 2 wherein said rings surrounding said first and second diffusions are at the potential of said ground potential terminal and said rings surrounding said third and fourth diffusions are at the potential of said supply terminal.

5. The device of claim 2 wherein said polysilicon rings completely surround their respective diffusions.

6. The device of claim 4 wherein said polysilicon rings completely surround their respective diffusions.

7. An integrated circuit chip suitable for operating at high voltages, said chip comprising:

a silicon substrate of a first conductivity type;

a silicon layer of a second conductivity type having at least one high voltage section and at least one low voltage section, at least one of said at least one high voltage section and at least one of said at least one low voltage section each including at least one diffusion region;

at least one isolation member for isolating the at least one high voltage section and at least one low voltage section;

a passivation layer located on an upper surface of the silicon substrate;

a plastic housing located on an upper surface of the passivation layer to enclose an upper surface of the chip;

a plurality of pin connectors extending through the plastic housing to provide electrical connection to the chip;

at least one polysilicon ring completely surrounding the at least one diffusion region and being connected to a supply potential terminal when said at least one diffusion region is P-type or to a ground potential terminal when said at least one diffusion region is N-type so that the electrical potential of said at least one polysilicon ring shields said silicon surface beneath said at least one polysilicon ring from the electrical potential formed by contaminant ions in said plastic housing thereby preventing surface field leakage caused by said contaminant ions; and source, drain and gate signal lines located on the upper surface of the chip, said at least one polysilicon ring being located beneath the source, drain and gate signal lines.

8. The integrated circuit chip of claim 7, wherein the at least one polysilicon ring is located in the passivation layer.

9. The integrated circuit chip of claim 7, wherein the at least one polysilicon ring is biased to said supply potential terminal to block field induced voltage.

10. The integrated circuit chip of claim 7, wherein the at least one polysilicon ring is spaced and isolated from the upper surface of the chip.

11. The integrated circuit chip of claim 7, wherein the at least one polysilicon ring is spaced and isolated from the plastic housing.

12. The integrated circuit chip of claim 7, wherein the at least one high voltage section and the at least one low voltage section each comprise an analog logic circuit formed of a CMOS device.

13. The integrated circuit chip of claim 7, wherein the at least one isolation member comprises one of a junction isolation layer and a dielectric isolation layer.

14. The integrated circuit chip of claim 7, further comprising an electrode connected to one of said supply potential terminal or said ground potential terminal and being located on the at least one polysilicon ring.

* * * * *